United States Patent
Yamamoto et al.

(10) Patent No.: US 7,527,400 B2
(45) Date of Patent: May 5, 2009

(54) LIGHT EMITTING DEVICE

(75) Inventors: Saiki Yamamoto, Tokushima (JP); Hideo Asakawa, Anan (JP)

(73) Assignee: Nichia Corporation, Anan-shi (JP)

( * ) Notice: Subject to any disclaimer, the term of this patent is extended or adjusted under 35 U.S.C. 154(b) by 96 days.

(21) Appl. No.: 11/826,675

(22) Filed: Jul. 17, 2007

(65) Prior Publication Data
US 2008/0043477 A1    Feb. 21, 2008

(30) Foreign Application Priority Data

Aug. 17, 2006  (JP)  ............................ 2006-222150
Nov. 27, 2006  (JP)  ............................ 2006-318927

(51) Int. Cl.
*F21V 15/01* (2006.01)
(52) U.S. Cl. ....................... 362/362; 362/800
(58) Field of Classification Search ............... 362/362, 362/364, 800; 257/98, 99, E33.056, E33.057, 257/E33.058, E33.066; 438/26; D13/180
See application file for complete search history.

(56) References Cited

U.S. PATENT DOCUMENTS

| | | | | |
|---|---|---|---|---|
| D550,171 S | * | 9/2007 | Yoon et al. | ................. D13/180 |
| 7,338,823 B2 | * | 3/2008 | Han et al. | ............ 257/E33.059 |
| D579,425 S | * | 10/2008 | Yoon et al. | ................. D13/180 |

FOREIGN PATENT DOCUMENTS

| | | |
|---|---|---|
| JP | H07-214600 A | 8/1995 |
| JP | 2000-77721 A | 3/2000 |

* cited by examiner

*Primary Examiner*—Y My Quach Lee
(74) *Attorney, Agent, or Firm*—Global IP Counselors, LLP

(57) ABSTRACT

A light emitting device, comprises: a light emitting element; a plurality of lead frames electrically connected to the light emitting element; and a package that extends in the lengthwise direction, has an opening in its front face for taking out light from the light emitting element, and makes one end of the lead frames to protrude to the outside thereof and sandwiches at least a part thereof, wherein the package has cut-outs in part of its outer surface on both sides in the lengthwise direction of the opening on the front face side, and the width of the cut-outs in the lengthwise direction increases from the rear face side toward the front face side, and the depth from the top face side toward the bottom face side increases from the rear face side toward the front face side.

6 Claims, 11 Drawing Sheets

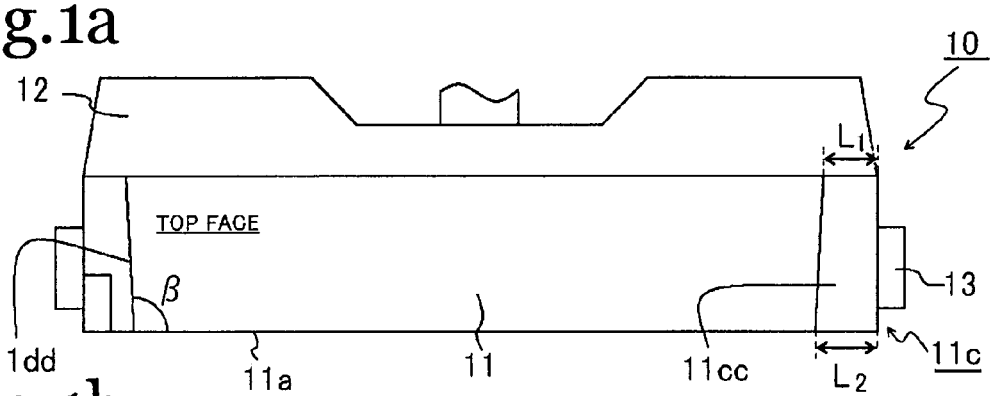
Fig.1a
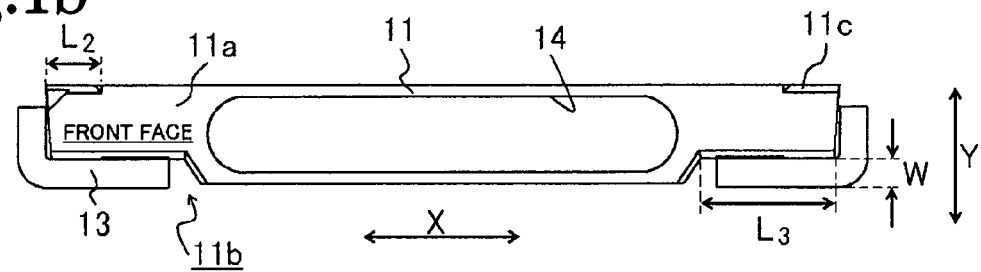
Fig.1b
Fig.1c
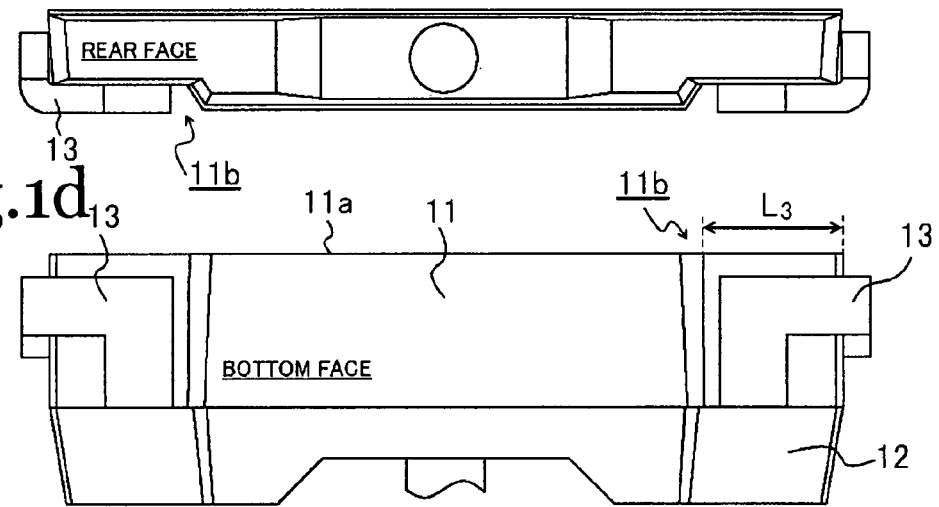
Fig.1d
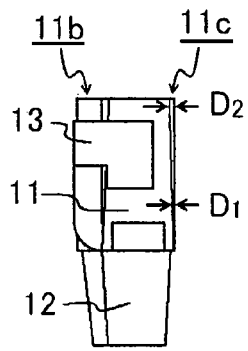
Fig.1e

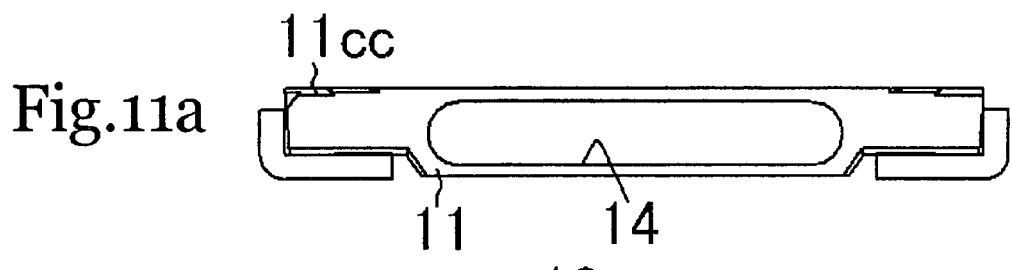
Fig.11a
Fig.11b
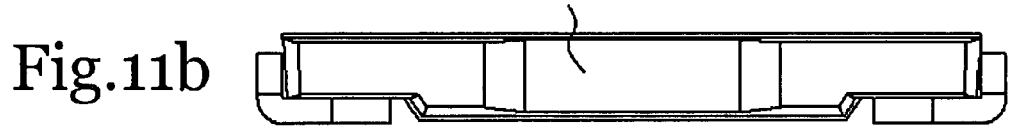
Fig.11c
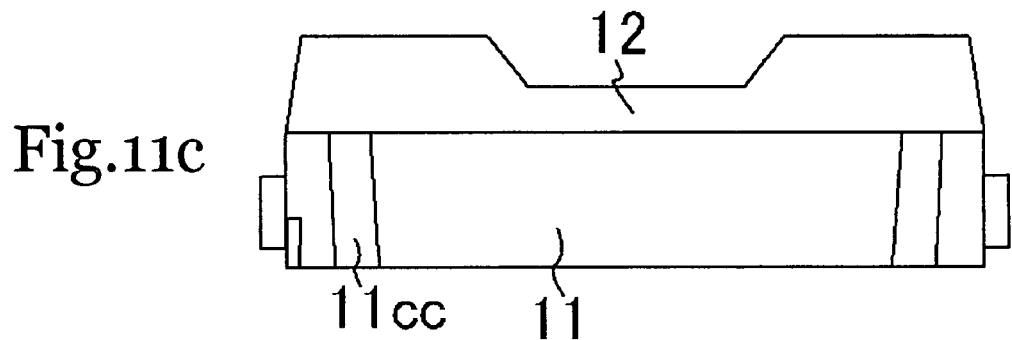
Fig.11d
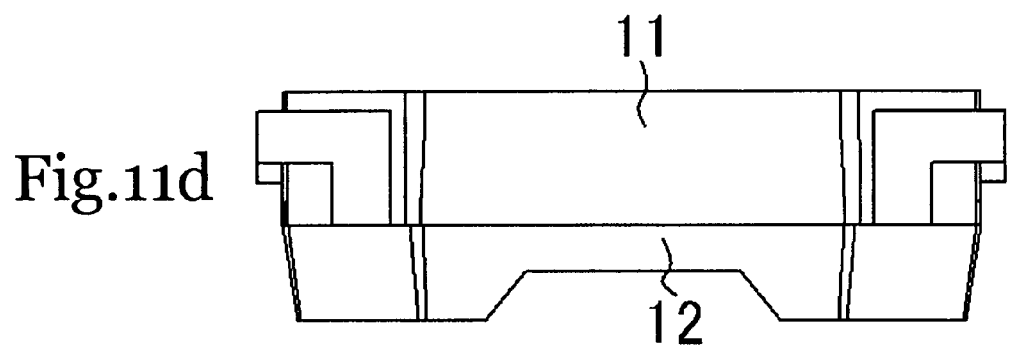
Fig.11e
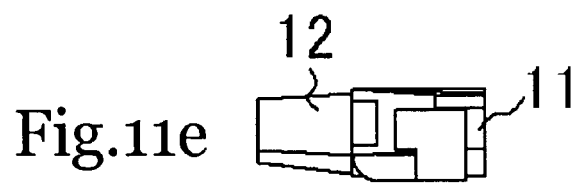
Fig.11f
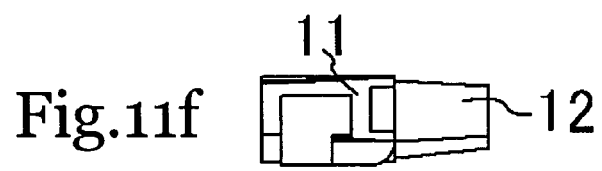

LIGHT EMITTING DEVICE

BACKGROUND OF THE INVENTION

1. Field of the Invention

The present invention relates to a light emitting device, and more particularly relates to a surface mount type of light emitting device that is compact and lightweight.

2. Background Information

Light emitting devices that are compact, have good sensitivity, and have light emitting elements with high brightness and high output have been developed and put to use in various fields in recent years. Because of their compact size, low power consumption, light weight, and other advantages, such light emitting devices have been used, for example, for light sources in portable telephones and liquid crystal backlights, as light sources for various kinds of meter, and as various kinds of read-out sensor.

A light source used for a backlight, for example, needs to have a thin construction so that the device in which it is used can be made more compact and lightweight. Therefore, the light emitting device used as the light source must itself be compact in size, and to this end a variety of light emitting devices have been developed in a configuration called a side view type.

A side view type of light emitting device is generally configured such that an opening for releasing light is formed in a side face of a package, a light emitting diode chip is mounted on the bottom face of the package, and part of a lead frame is taken as an external terminal from the inside of the package to the outside. Such side view type of light emitting device is usually formed by molding a resin using a metal mold in which lead frames are sandwiched.

However, as the size of these side view type of light emitting devices have decreased, their walls have become extremely thin, so that they sometimes cannot withstand the parting resistance with the mold when the molded package is removed from the mold, causing the thin wall portions to tear and lose their shape.

Accordingly, it is has been proposed that parting can be facilitated by using ejector pins to eject specific regions on the top face or rear face sides of the upper and lower molds (for example, JP-H07-214600-A).

It has also been proposed that removal of a molded package from a mold can be facilitated by forming relatively gentle tapers at two stages on the top face of a light emitting diode chip (for example, JP-2000-77721-A).

However, when ejector pins are used as discussed above, because holes are made in the mold for inserting the ejector pins, and the injector pins are inserted through these holes, tiny gaps are produced between the ejector pins and the holes. Consequently, the problem is that the package material finds its way into these gaps and results in flash when the package is removed from the mold. If flash is produced on the package surface, depending on how the package is to be used, there may be difficulty in positioning with other members, and misalignment may occur, which can have a serious effect on the design of a system in which this light emitting device is used.

SUMMARY OF THE INVENTION

The present invention was conceived in an effort to solve these problems, and it is an object thereof to provide a light emitting device that facilitates the manufacture of packages that are extremely compact and in the form of thin films, and that improves the handling and yield of these packages, and can be efficiently and effectively combined with other members.

The present invention provides a light emitting device, comprising:

a light emitting element;

a plurality of lead frames electrically connected to the light emitting element; and a package that extends in the lengthwise direction, has an opening in its front face for taking out light from the light emitting element, and makes one end of the lead frames to protrude to the outside thereof and sandwiches at least a part thereof, wherein the package has cut-outs in part of its outer surface on both sides in the lengthwise direction of the opening on the front face side, and the width of the cut-outs in the lengthwise direction increases from the rear face side toward the front face side, and the depth from the top face side toward the bottom face side increases from the rear face side toward the front face side.

With the light emitting device of the present invention, cut-outs are made on both ends on the front face side of the package, with a specific taper to the width and depth, which unexpectedly reduces mold parting resistance in the manufacture of extremely compact, thin film packages. As a result, it is possible to obtain a light emitting device that has good dimensional precision and is easy to handle.

Also, thus providing tapered cut-outs at specific places on the package eliminates the need to use the ejector pins that were utilized in the past, and therefore avoids the production of flash that occurred when these pins were used, and allows the package to be effectively and efficiently combined with other members.

Furthermore, combination error and misalignment can be prevented by utilizing the stepped height different in the outer surface of the package produced by the tapered cut-outs to position with other members.

The light emitting device of the present invention can be utilized in not only in lighting apparatus used for image readers in facsimile machines, copiers, hand scanners, and the like, but also in illumination light sources, light sources for LED displays, portable phones and the like, signaling devices, lighted switches, vehicle brake lamps, various sensors, various indicators, and various other types of lighting apparatus for example as a surface-mount light emitting devices in which light emitting diodes (as a light emitting elements) are mounted and light is emitted from the side face of the package to the side direction.

BRIEF DESCRIPTION OF THE DRAWINGS

FIGS. 1*a* to 1*e* are simplified views, with 1*a* being a plan view, 1*b* a front view, 1*c* a rear view, 1*d* a bottom view, 1*e* a side view of the main components in the light emitting device of the present invention;

FIGS. 11a to 11f are simplified view, with 11a being a front view, 11b a rear view, 11c a plan view, 11d a bottom view, 11e a left side view, 11f a right side view of the main components in another light emitting device of the present invention.

DETAILED DESCRIPTION OF THE PREFERRED EMBODIMENTS

Figure 2A:
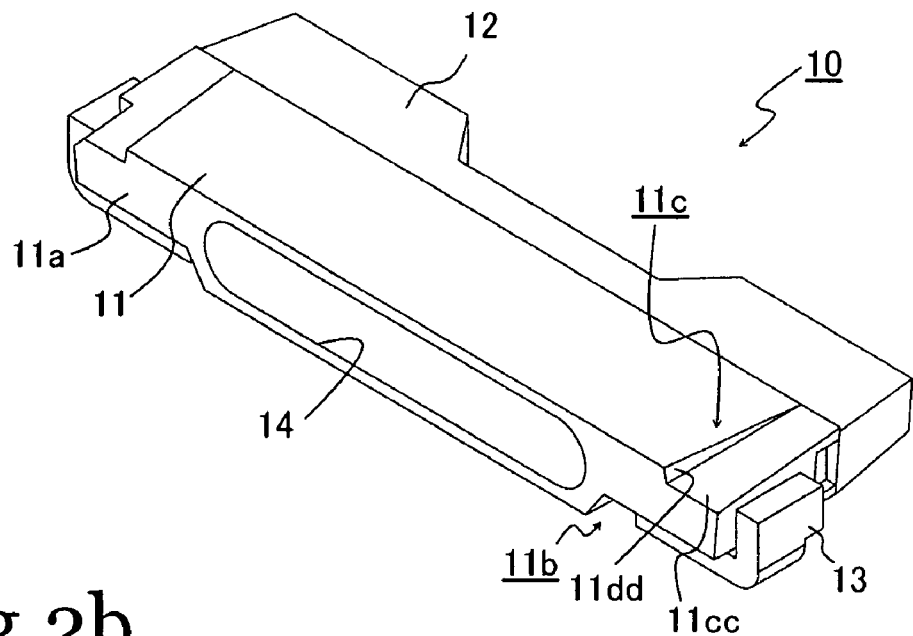
FIGS. 2*a* to 2*c* are simplified oblique views of the main components in the light emitting device of the present invention.

A light emitting device of the present invention mainly comprises light emitting elements, lead frames, one end of which functions as a lead terminal, and a package which sandwiches the lead frames.

Light Emitting Element

The light emitting element is generally semiconductor light emitting element, especially, any semiconductor light emitting element may be used so long as it is element called light emitting diodes. For example, it includes a laminated structure that contains an active layer on a substrate, which is made of a nitride semiconductor such as InN, AlN, GaN, InGaN, AlGaN, and InGaAlN, and a compound semiconductor of a group III-V element, a II-VI element, and the like. The structures of semiconductor includes a homostructure having MIS junction, PIN junction, or PN junction or the like, a heterostructure, and a double heterostructure. Furthermore, a multilayer laminate structure or an ultra lattice structure are also acceptable, as are a single quantum well structure or a multiquantum well structure laminated as a thin film which generates quantum effects. The active layer may contain a donor impurity such as Si, Ge, or the like, and acceptor impurity such as Zn, Mg, or the like. A wave length of the obtained light emitting element may be changed from ultraviolet to red region depending on a material of the semiconductor, a mixed crystal rate, In content of InGaN or the like of the active layer, kind of the impurity doped in the active layer.

The light emitting elements are mounted on the lead frames (discussed below), and a joining material is used for this purpose. For instance, in the case of light emitting elements formed by growing a nitride semiconductor on a sapphire substrate, that emit blue and green light, an epoxy resin, silicone, or the like can be used. When degradation due to light or heat from the light emitting elements is taken into account, the back side of the light emitting elements may be plated with aluminum, and/or using bonding material such as a resin, a solder (e.g., eutectic Au—Sn), a brazing material (e.g., a low-melting point metal), a conductive paste may be used. In the case of a light emitting element with electrodes formed on both sides, such as a light emitting element that is formed by GaAs, or the like and emits red light, die bonding may be performed using a conductive paste made of silver, gold, palladium, or the like.

The light emitting device of the present invention may comprise just one light emitting element, or a plurality of them may be mounted. In the latter case, a plurality of light emitting elements that emiit light of the same color may be combined for increasing luminosity. Color reproduction can be enhanced by combining a plurality of light emitting elements that emit light of different colors, so as to handle RBG, for instance.

Lead Frames

The lead frames are electrodes used for electrically connecting to the light emitting elements, and may be substantially flat, or may be undulating, or may be in the form of a bumpy sheet. The thickness may be uniform, thick partially or thin. There are no particular restrictions on the material, but forming the lead frames from a material with a relatively high thermal conductivity is preferable. Forming from such a material allows the heat generated by the light emitting elements to escape more efficiently. For example, it is preferable to use a material that has a thermal conductivity of about 200 W/(m.K) or higher, or one with a relatively high mechanical strength, or one that lends itself well to punching, etching, or other such processing. More specifically, examples include copper, aluminum, gold, silver, tungsten, iron, nickel, and other such metals, and alloys such as iron-nickel or phosphor bronze. Also, the surface of the lead frames is preferably given a reflective plating so that the light from the mounted light emitting elements can be taken off more efficiently.

The size, shape, and so forth of the lead frames can be suitably adjusted after taking into account the size, shape, and so forth of the light emitting device to be obtained. Also, since lead frames are usually processed by bending on the outside of the package, it is preferable if burrs and the like are moved from the portions of the lead frames that will come into contact with the side walls of the package, or from portions near the package, and if these edge portions are rounded. This allows the lead terminals to be processed as desired, without sacrificing the shape of the package.

Each lead frame has a region in which a light emitting element is disposed inside the package (discussed below) and/or a region that is disposed inside the package and that is electrically connected to a light emitting element, and a region that protrudes from one face or side of the package and functions as a lead terminal.

Usually, two or more lead frames are provided to a single light emitting device, and it is good for their to be one more lead frame than there are light emitting elements, or for there to be at least twice as many lead frames as light emitting elements. For instance, if just one light emitting element is used, the light emitting element is mounted on one of the lead frames, an electrical connection is made with one of the electrodes of the light emitting element, and the other lead frame is electrically connected with the other electrode of the light emitting element.

There are no particular restrictions on the extending direction of the lead frame, and its direction can be suitably adjusted after taking into account mounting type, for example, a side view type, a top view type, or the like.

Preferably, the lead frames are protruded from the outside of packages 11 and 12 at both side faces of the packages, or as shown in FIG. 1b, from one side of a wall facing in the short direction Y (the wall extending to the lengthwise direction X, hereinafter the same meaning) near both ends in the lengthwise direction X.

The lead frames are electrically connected to the light emitting element in a partial region. This partial region, as discussed below, is usually a region of the lead frames inserted into the package, disposed so as to be exposed from the bottom face of the opening formed in the front face of the package. The electrical connection between this partial region and the light emitting element can be effected by face-up mounting using a conductive wire, flip-chip mounting using a conductive member, or the like.

Examples of the conductive member used for flip-chip mounting include gold and other metal bumps, Au—Sn eutectic crystals and other types of solder, anisotropic conductive materials, and silver and other conductive pastes. A wire will preferably have good ohmic characteristics with the electrodes of the light emitting element, or good mechanical connectivity, or good electrical conductivity and thermal conductivity. The thermal conductance is preferably at least about 0.01 cal/S·cm²·° C./cm, and even more preferably at least about 0.5 cal/S·cm²·° C./cm. When ease of work is taken into account, the diameter of the wire is preferably about 10 to 45 μm. Examples of the material of this wire include gold, copper, platinum, aluminum, and other such metals and alloys thereof.

Package

The package may be formed of any material as long as the package protects the light emitting elements and is formed integrally with the lead frames, and insulation of the light emitting elements and the lead frames can be ensured. For instance, thermoplastic resins, thermosetting resins, and so forth can be used, specific examples of which include polyphthalamide (PPA), polycarbonate resin, polyphenylene sulfide (PPS), liquid crystal polymer (LCP), ABS resin, epoxy resin, phenol resin, acrylic resin, PBT resin, and other such resins, and ceramics.

Various kinds of dye, pigment, or the like may also be mixed into these materials as colorants or light diffusers: This makes it possible to keep the amount of emitted light absorbed by the package to a minimum, or to obtain a white package with high reflectivity. Examples of colorants include $Cr_2O_3$, $MnO_2$, $Fe_2O_3$, and carbon black, and examples of light diffusers include calcium carbonate, aluminum oxide, and titanium oxide. The package usually has an opening (discussed below) that is filled with a translucent covering material, so it is preferable to select materials with little different in their coefficients of thermal expansion, taking into account factors such as adhesion between the translucent covering material and the package that has been subjected to the effects of heat produced from the light emitting elements and so forth.

Figure 3:
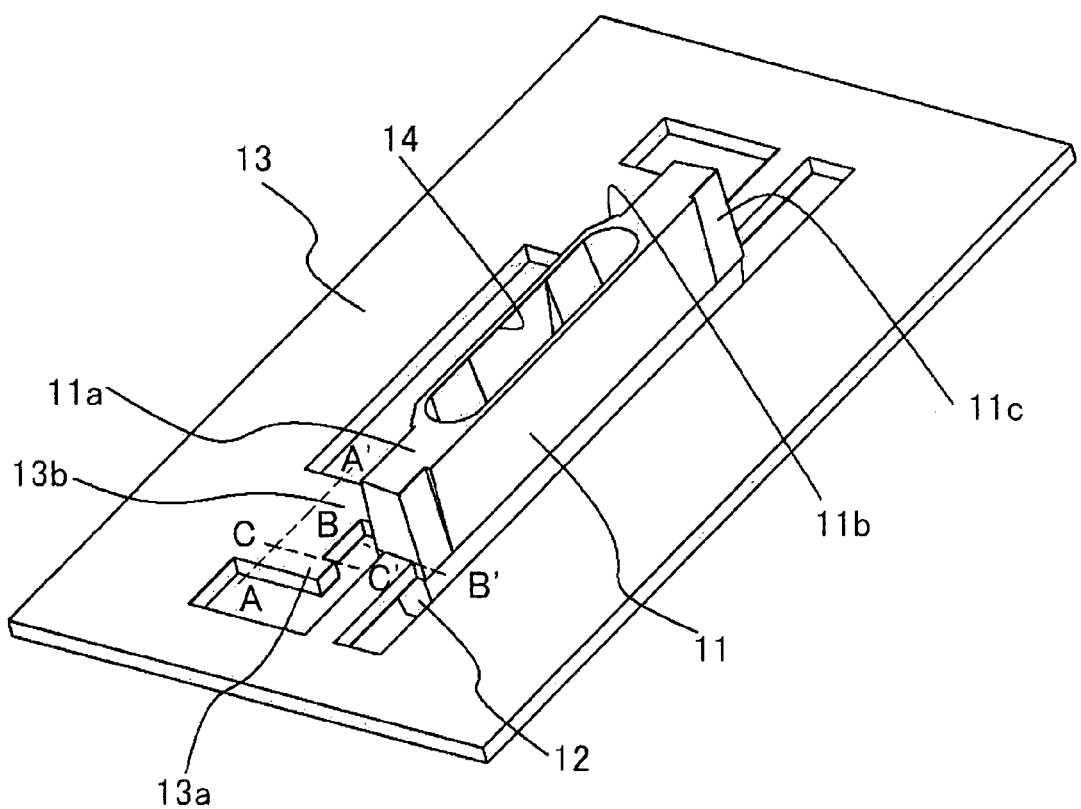
FIG. 3 is a simplified oblique view of the package and the read flame in the light emitting device of the present invention.

Since the package is formed by sandwiching the above-mentioned lead frames between upper and lower metal molds, and injecting the above-mentioned material into the cavity of these upper and lower molds (see FIG. 3), hereinafter in this Specification, as shown in FIG. 3, for example, the package portions corresponding to the upper and lower lead frames 13 will be called the front face side package 11 and the rear face side package 12. In other words, the front face side package 11 is the package portion on the side where light is taken off with respect to the lead frames 13, and the rear face side package 12 is the package portion on the opposite side.

There are no particular restrictions on the size and shape of the package, and the external shape in front view (see FIG. 1b) may, for example, be circular, elliptical, triangular, quadrangular, polygonal, or deformed shape that is altered thereof to have concave, convex etc., partially. Of these, a shape that is extended in the lengthwise direction is preferable.

An opening for mounting a light emitting element is formed in the surface of the front face side package. This opening may be formed at any location on the front face side package according to the type of mounting used in the light emitting device, but is preferably formed in the front face of the front face side package, that is, in a direction perpendicular to either the lengthwise direction (the X direction in FIG. 1b) or the short direction (the Y direction in FIG. 1b). This allows a side view type of light emitting device to be obtained with an extremely compact size and in the form of a thin film.

There are no particular restrictions on the shape of the opening, and as long as part of the surface of the lead frames where the light emitting element is mounted and an electrical connection is made is exposed within the opening, and preferably on the bottom face of the opening, this shape may be circular columnar, elliptical columnar, triangular columnar, quadrangular columnar, polyhedral columnar, dome-shaped, arm-shaped, or a shape similar to these, a deformed shape, or the like. This allows light from the light emitting element to be reflected by the package inner walls and taken off efficiently in the direction of the front face. The size, depth, etc., of the opening can be suitably adjusted as dictated by the number of light emitting elements to be mounted, the bonding method, and so forth. However, when the size of the light emitting device itself, the thickness of the package walls, and so on are taken into account, the opening and the above-mentioned concavity and/or convexity, especially concavity are preferably disposed so as not to overlap. The bottom face and/or side faces of the opening are preferably subjected to embossing, plasma treatment, or the like to increase the contact surface area and improve the fit with the translucent covering member discussed below.

The light emitting device package of the present invention has cut-outs at one ends of the opening and the front face side, that is, in part of the outer surface on both sides of the opening in the lengthwise direction.

In plan view, the cut-outs are formed such that their width in the lengthwise direction increases from the rear face side toward the front face side. That is, as shown in FIGS. 1a and 1b, a cut-out 11c formed in the front face side package 11 has a width L1 in the lengthwise direction of the rear face side that is smaller than its width L2 in the lengthwise direction on the front face side. These widths may be formed such that the cut-out widens in stages from the rear face side toward the front face side, but the cut-out preferably widens continuously or gradually. There are no particular restrictions on the widening from the width L1 to the width L2, but it is favorably within a range of 2 L1>L2, for example. Also, the width L2 on the front face side is less than the width L3 of a concavity 1 1b at the front face. Therefore, from another standpoint, the widening from the width L1 to the width L2 may be such that the width L2 becomes less than the width L3, as shown in FIG. 1b. From yet another standpoint, this cut-out is preferably such that in plan view, the angle 3 (see FIG. 1a) formed by the side face on the opening side of the cut-out and the front face of the package may be greater than 90° and no more than 135°, preferably, greater than 93° and no more than 120°, more preferably greater than 93° and no more than 105°.

Figure 4A:
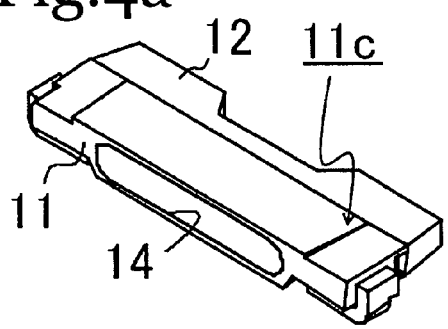
FIGS. 4*a* to 4*e* are simplified oblique views of the main components in several light emitting devices of the present invention.
Figure 4B:
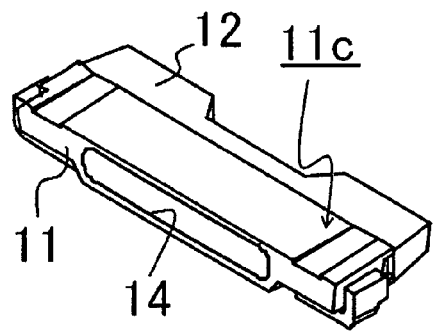

As shown in FIG. 2a, this cut-out may be formed from the end of the package in the lengthwise direction, or, as shown in FIG. 4b, it may be formed a specific distance to the inside (toward the opening) from the end of the package in the lengthwise direction.

Figure 2B:
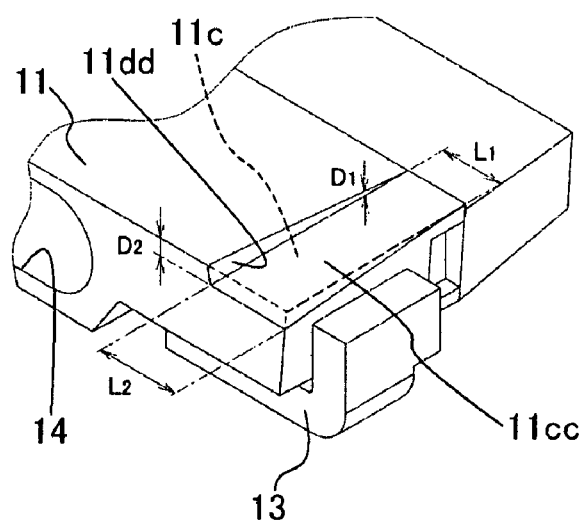
Figure 4C:
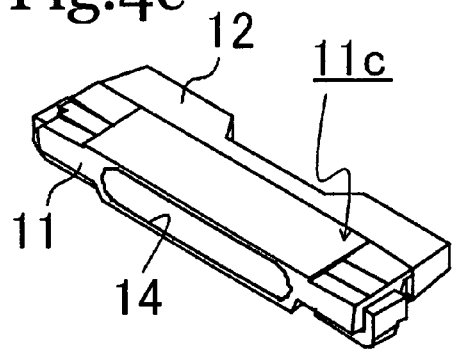
Figure 4D:
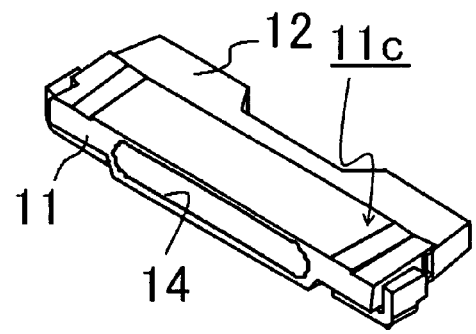

Further, the cut-outs are formed such that the depth from the top face side toward the bottom face side increases from the rear face side toward the front face side. That is, as shown in FIGS. 1e and 2b, the depth D2 on the front face side is greater than the depth D1 on the rear face side. The cut-outs may be formed such that they increase in depth in stages, namely, in two stages or, as shown in FIG. 4c, in three or more stages, from the rear face side toward the front face side, or they may deepen continuously or gradually and may have two or more stepped drop-offs, but preferably deepen continuously or gradually. The number of steps may also differ between the two ends. There are no particular restrictions on the extent of depth from the depth D1 to the depth D2, but the angle α (see FIG. 2c) formed by the bottom face 11cc of the cut-out 11c and the front face 11a of the package 11, for example, is preferably set to be greater than 90° and no more than 135°, more preferably greater than 93° and no more than 120°, greater than 93° and no more than 105°. The cut-outs may also be formed such that there are a plurality of different angles formed by the bottom face 11cc of the cut-out 11c and the front face 11a of the package 11 in the lengthwise direction (width direction) of the package, such as two or more types as shown in FIG. 4d. Put another way, the cut-out may have two or more steps in the lengthwise direction (width direction). In this case, the number of steps may differ between the two ends. With this configuration, strength is ensured by minimizing the tapering of the package walls, and the parting resistance attributable to the tapered shape is also kept to a minimum.

Figure 5A:
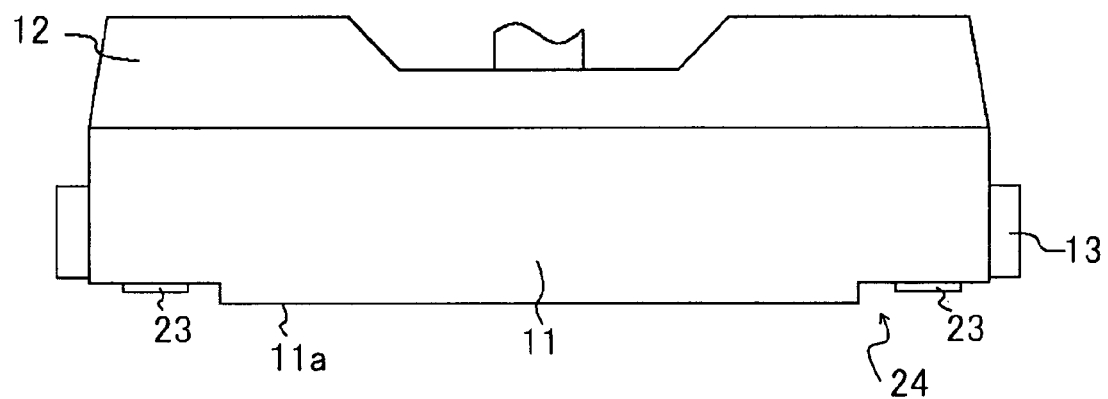
FIGS. 5a and 5b are simplified views, with 5a being a plan view, 5b a front view of the main components in conventional light emitting device.
Figure 5B:
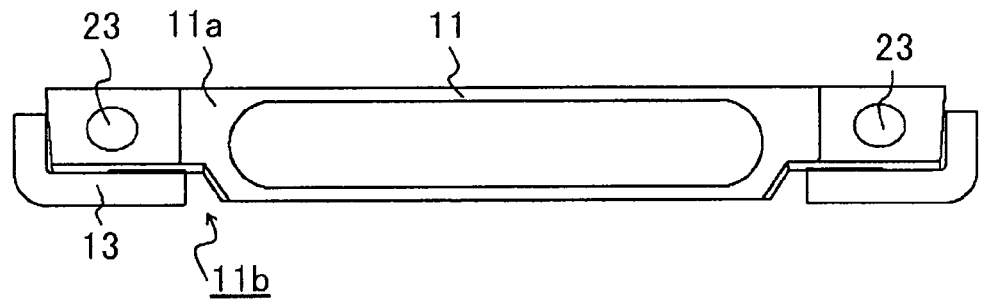

Employing a tapered shape such as this allows parting resistance of the package from the mold to be kept to a minimum, and ensures a flat region on the other outer surface side of the wall facing the short direction even though the package itself is made very small, and allows the product to be handled (transported, etc.) more easily by using a suction device or the like. Also, providing this tapered shape eliminates the need for the ejector pins used in the past, so as shown in FIGS. 5a and 5b, for example, it is possible to avoid the production of flash 23 that would otherwise be formed on the front face side package 11 if ejector pins were used. In addition, in the past a step 24 for absorbing the flash 23 was formed on the front face (see 11a in FIGS. 5a and 5b) where the opening was formed in the front face side package 11 in order to avoid misalignment and so forth that occurred when this flash 23 was produced, but with the present invention this step 24 does not need to be formed, and the front face 11a of the front face side package 11 can be formed as a single, flat surface as shown in FIG. 1a and elsewhere. This makes it possible for the light emission face to be more uniformly flat, and, for example, leakage of light from a light guide plate used in combination with the light emitting device of the present invention can be kept to a minimum.

Figure 4E:
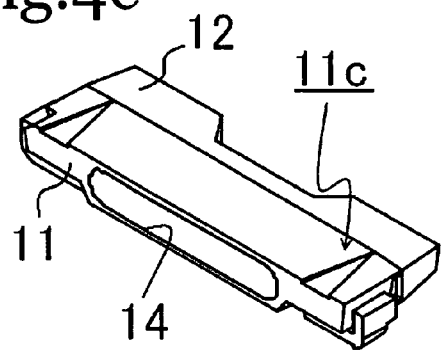

Furthermore, the cut-out may be quadrangular or substantially quadrangular in plan view as shown in FIGS. 4a to 4d, or may be triangular or substantially triangular as shown in FIG. 4e.

Also, as shown in FIGS. 1a to 1e, at least the front face side package 11 may have concavities 11b formed at both ends extending in the lengthwise direction X, in the wall on the opposite side from the wall in which the cut-outs 11c are formed, that is, in the outer surface of the wall facing the short direction Y, in a specific width L3 from the lengthwise direction end (the length in the lengthwise direction X from the lengthwise direction end). There are no particular restrictions on the size and shape of the concavities 11b, but it is favorable, for example, for them to have a width L3 able to accommodate external terminals of the above-mentioned lead frames 13. The depth W of the concavities 11b is preferably substantially equal to the thickness of the lead frame 13. Setting the depth W in this way allows the lead frames accommodated in the concavities and the outer surface other than the concavities, that is, part of the outer surface of the other wall facing in the short direction Y, to be substantially flush with the lead frame, and allows the space occupied by the light emitting device itself to be further reduced.

The light emitting devices of the present invention also include the devices shown in FIGS. 8a to 12f.

A protective element other than a light emitting element may also be mounted in the light emitting device of the present invention. There may be just one protective element, or there may be two or more. There are no particular restrictions on the protective element, and any known type that is mounted in light emitting devices may be used. Specific examples include elements that protect against overheating, over-voltage, over-current, and static electricity, and circuit protection elements, that is, Zener diode, diode of a transistor, or the like.

With the light emitting device of the present invention, the opening in which the light emitting element is located is preferably filled with a translucent covering material. This translucent covering material protects the light emitting element from external force, moisture, and so forth, and also protects wires. Examples of this translucent covering material include epoxy resin, silicone, acrylic resin, urea resin, and other transparent resins, glass, and so forth with excellent weather resistance. In particular, even if moisture should be admixed into the translucent covering material during manufacture or storage, any moisture contained in the transparent resin can be released to the outside by baking for at least 14 hours at 100° C. Therefore, it is possible to prevent separation between the light emitting element and a molding member, and steam explosion.

The translucent covering material may contain a diffuser or a fluorescent substance. A diffuser is an agent that diffuses light, and serves to lessen directionality from the light emitting element and to widen the viewing angle. A fluorescent substance is one that converts light from the light emitting element, and is able to convert the wavelength of light emitted from the light emitting element to the outside of the package. If the light from the light emitting element is visible light with a short wavelength and high energy, then it is favorable to use an inorganic phosphorescent material such as ZnCdS:Cu, YAG:Ce, or nitrogen-containing $CaO—Al_2O_3—SiO_2$ that has been activated with europium and/or chromium, or a perylene derivative, which is an organic phosphorescent material. With the present invention, when white light is to be obtained, particularly when a YAG-Ce phosphorescent material is used, depending on the content thereof, it is possible to emit yellow light that absorbs part of, and is a complement to, the light from a blue light emitting element, and white light can be formed relatively simply and with good reliability. Similarly, when nitrogen-containing $CaO—Al_2O_3—SiO_2$ that has been activated with europium and/or chromium is used, depending on the content thereof, it is possible to emit red light that absorbs part of, and is a complement to, the light from a blue light emitting element, and white light can be formed relatively simply and with good reliability. Also, color unevenness can be reduced by completely precipitating the phosphorescent material and removing bubbles.

Examples of the light emitting device of the present invention will now be described in detail through reference to the drawings.

EXAMPLE 1

Figure 2C:
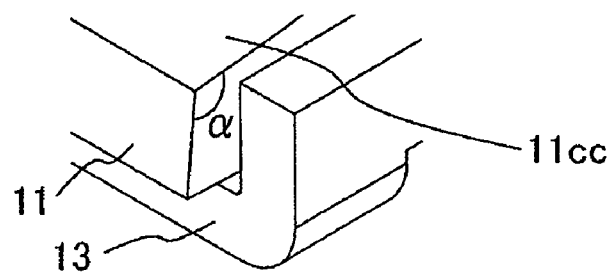

The light emitting device in this Example 1 is shown in FIGS. 1a to 1e and 2a to 2c, in which 1a is a plan view, 1b is a front view, 1c is a rear view, 1d is a bottom view, 1e is a side view, and FIGS. 2a to 2c are simplified oblique views of the main components in the light emitting device.

The light emitting device 10 in this Example comprises a single light emitting element (not shown), a lead frame 13 in which this light emitting element is mounted and which is electrically connected by a wire to one of the electrodes of the light emitting element, a lead frame 13 that is electrically connected by a wire to the other electrode of the light emitting element, and front face side and rear face side packages 11 and 12 to which these lead frames 13 are integrally fixed.

As shown in FIG. 3, for example, the lead frames 13 are formed by plate-like bodies composed of a copper alloy containing iron. The lead frames 13 are equipped with a region in which the light emitting element is mounted or which is electrically connected to the light emitting element, and a portion that extends from this region to the outside of the package and functions as a lead terminal. The lead frames 13 functioning as a lead terminal are machined into a suitable shape outside of the package. Particularly in portions that are machined in a curved shape, and that are disposed near the package or in contact with the wall face of the package, any flash is removed and the edges are rounded. The surface of the lead frames 13 is silver plated so that light from the mounted light emitting element can be taken off more efficiently.

The front face side and rear face side packages 11 and 12 are integrally fixed so that part of the lead frames 13 protrudes, and their outer shape is close to that of a parallelepiped. A rounded rectangular opening 14 is formed near the center of the front face side package 11 in the direction perpendicular to both the lengthwise direction X in which the front face side package 11 extends and the short direction Y perpendicular thereto (see FIG. 1b).

The front face 11a of the front face side package 11 in which is formed the opening 14 is formed as a flat surface (see FIGS. 1a and 1d).

Furthermore, the concavities 11b are formed in the bottom face side at both ends in the lengthwise direction X in which the front face side package 11 extends, that is, at a specific width L3, such as 60 μm, toward the package rear face side from the ends of the package in the lengthwise direction X, in the outer surface of one wall facing in the short direction Y. In other words, the concavities 11b have a shape such that the side faces (one outer surface of the wall facing in the short direction Y) is cut out from the corner. The thickness of the concavities 11b is fairly comparable to the thickness W of the lead frames 13, and is about 120 μm, for example (see FIG. 1b).

Meanwhile, the cut-outs 11c are formed on the front face sides at both ends in the lengthwise direction X in which the front face side package 11 extends, that is, the other outer surface of the wall facing in the short direction Y, in a width that is less than the width L3 of the concavities 11b; for example, the width L2 on the package front face side is 25 μm and the width L1 on the package rear face side is 22 μm (see FIG. 1b). In this case the angle ∝ formed by the bottom face 11cc of the cut-out 11c and the front face 11a of the package 11 is 93° and the angle β formed by the side face 11dd on the opening side of the cut-out 11c and the front face 11a of the package is 95° in plan view (see FIG. 1a). This allows the parting resistance of the package from the mold to be kept to a minimum.

The lead frames 13 protruding to the outside of the front face side and rear face side packages 11 and 12 are accommodated in the concavities 11b in the front face side package 11. That is, as shown in FIG. 3, the lead frame 13 is molded so as to be sandwiched by the front face side and rear face side packages 11 and 12, after which they are cut along the A-A' line and the B-B' line. After this, the portion of the lead frames 13 corresponding to 13a is curved along the C-C' line in a direction perpendicular to the lead frame plate. The portion corresponding to 13b is curved in a direction that follows the wall of the front face side package 11. This allows the lead frames 13 protruding to the outside of the front face side and rear face side packages 11 and 12 to fit within the concavities 11b of the front face side package 11. The lead frames 13 are substantially flush with the outer surface of part of the other wall facing in the short direction Y.

With the light emitting device in this Example, as discussed above, the walls that constitute the cut-out are tapered, which makes it possible to avoid the production of very fine flash or the like and to machining to remove this flash, and the extreme difficulty in controlling dimensional precision in the manufacture of an extremely compact package. As a result, even if the package itself has been made extremely small, the light take-off face can be made flat regardless of the usage mode, so leakage of light from a light guide plate used in combination with the light emitting device can be kept to a minimum.

Furthermore, utilizing a height differential produced by a taper at the outer surface of the wall of the front face side package allows for positioning with other members and better alignment precision, and makes it possible to provide a light emitting system of higher quality.

EXAMPLE 2

As shown in FIG. 4c and 10a to 10f, the light emitting device of this Example has the same constitution as in Example 1, except that the plane of the cut-outs 11c comprises a plurality of steps from the front face to the rear face.

With this constitution, it is possible to achieve better alignment precision with other members such as a light guide plate than in Example 1. Also, a cathode mark can be produced by varying the number of steps between the left and right cut-outs.

EXAMPLE 3

As shown in FIG. 4d and 11a to 11f, the light emitting device of this Example has the same constitution as in Example 1, except that the plane of the cut-outs 11c comprises a plurality of steps in the side face direction.

This yields the same effect as in Example 2.

EXAMPLE 4

Figure 6:
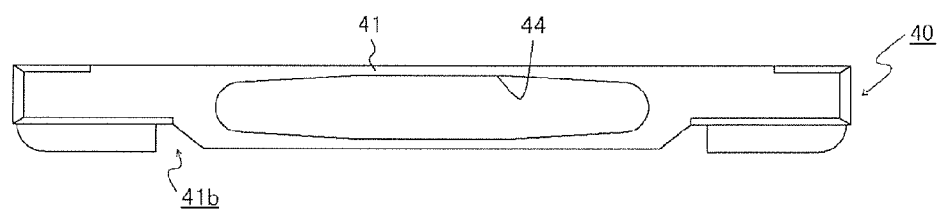
FIG. 6 is a simplified front view of the main components in another the light emitting device of the present invention.

As shown in FIG. 6, the light emitting device 30 of this Example has a plurality of light emitting elements (not shown) mounted, and lead frames 33 protrude from the walls of a front face side package 31 facing in the short direction. Concavities are also formed in the walls facing in the short direction, and the lead frames are accommodated in these concavities. The shape of an opening 34 is substantially rectangular, and the structure is substantially the same as that in Example 1 except that concavities are also formed in the opening, corresponding to the concavities in the walls of the front face side package 31.

This yields the same effect as in Example 1.

EXAMPLE 5

Figure 7:
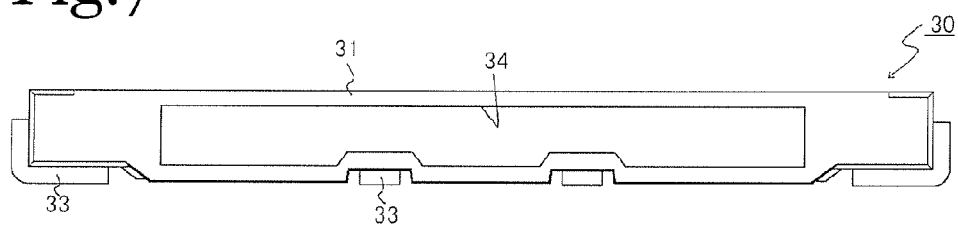
FIG. 7 is a simplified front view of the main components in yet another the light emitting device of the present invention.
Figure 8A:
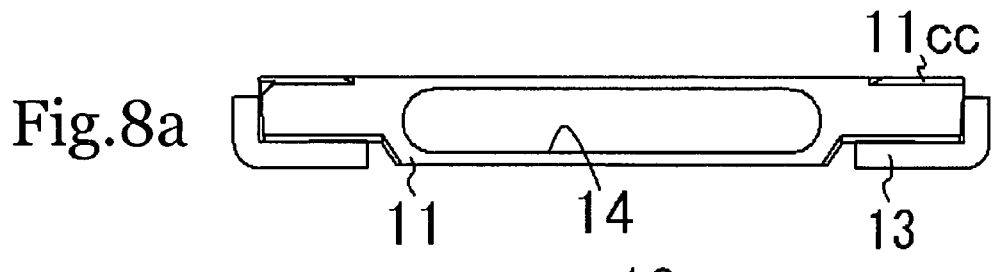
FIGS. 8a to 8f are simplified view, with 8a being a front view, 8b a rear view, 8c a plan view, 8d a bottom view, 8e a left side view, 8f a right side view of the main components in another light emitting device of the present invention.
Figure 8B:
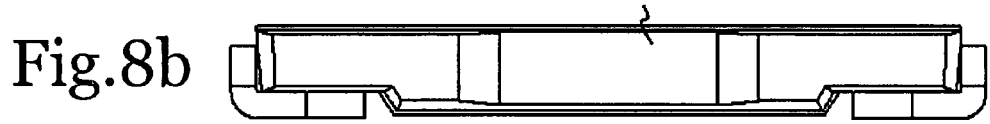
Figure 8C:
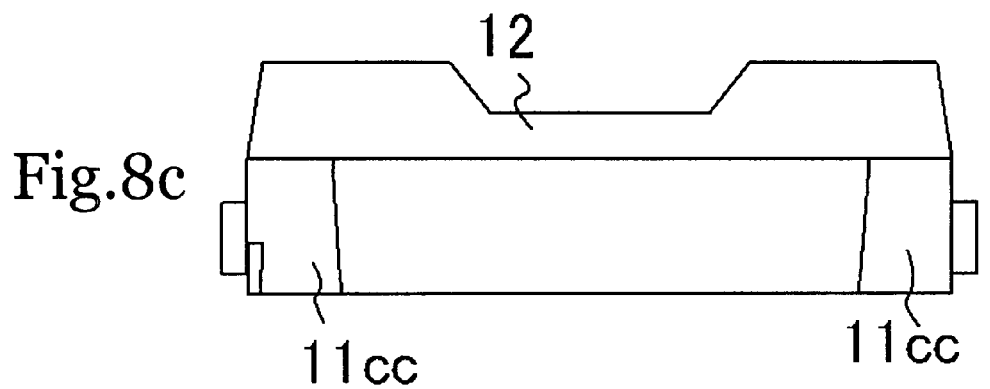
Figure 8D:
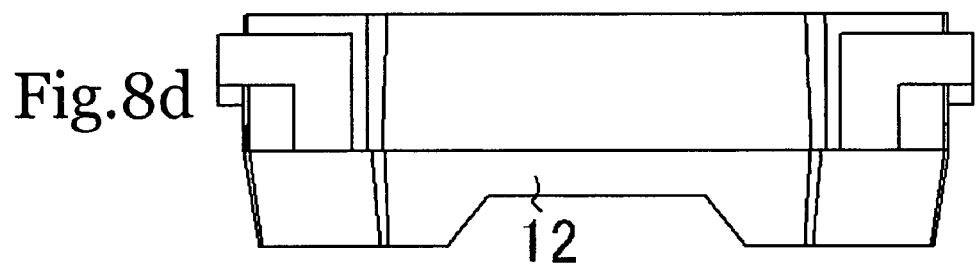
Figure 8E:
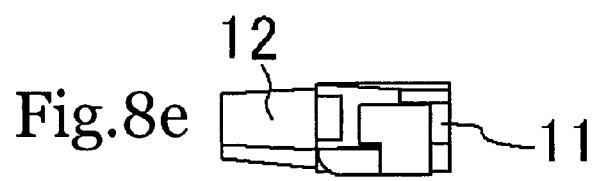
Figure 8F:
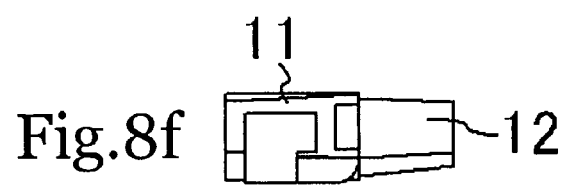
Figure 9A:
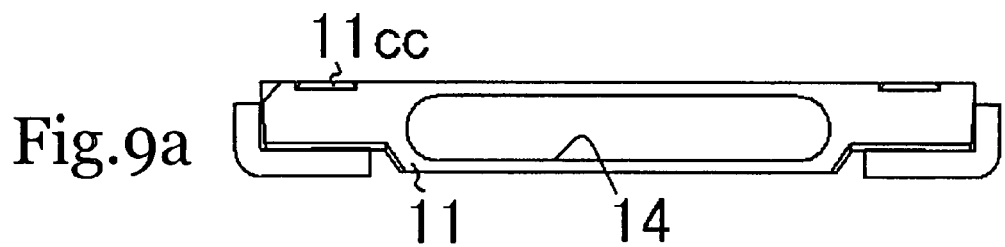
FIGS. 9a to 9f are simplified view, with 9a being a front view, 9b a rear view, 9c a plan view, 9d a bottom view, 9e a left side view, 9f a right side view of the main components in another light emitting device of the present invention.
Figure 9B:
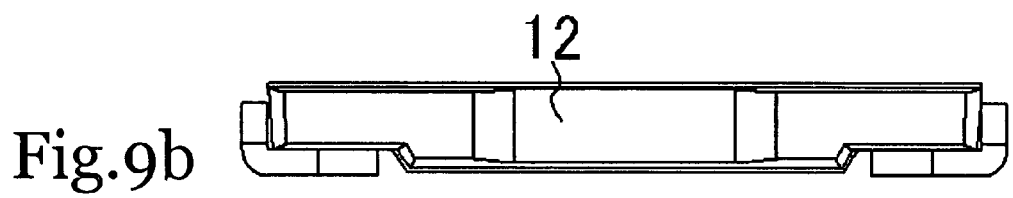
Figure 9C:
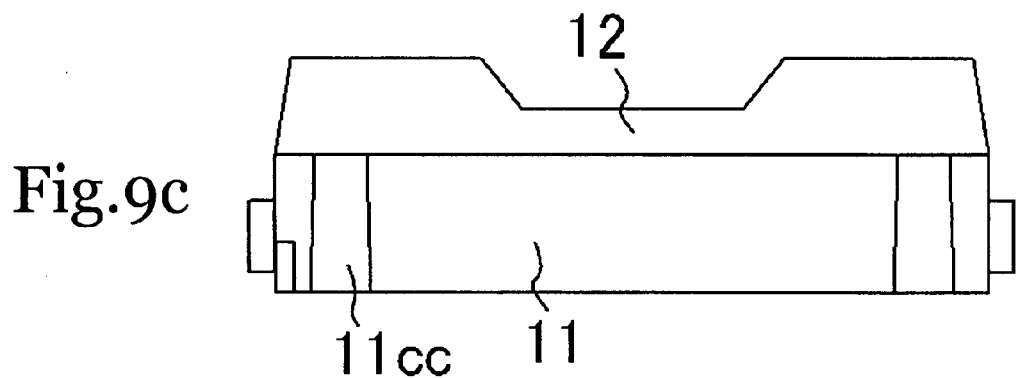
Figure 9D:
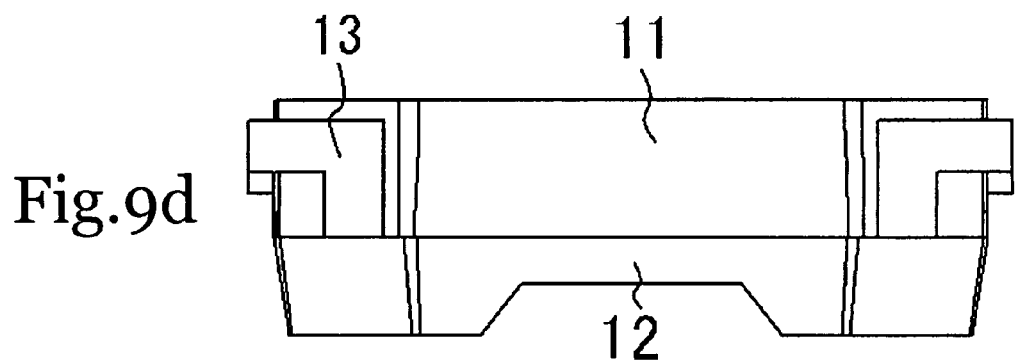
Figure 9E:
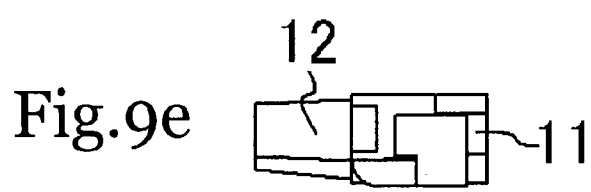
Figure 9F:
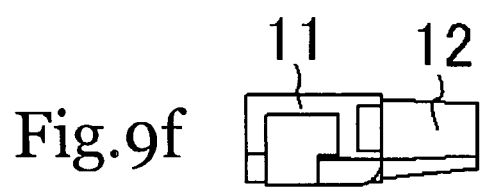
Figure 10A:
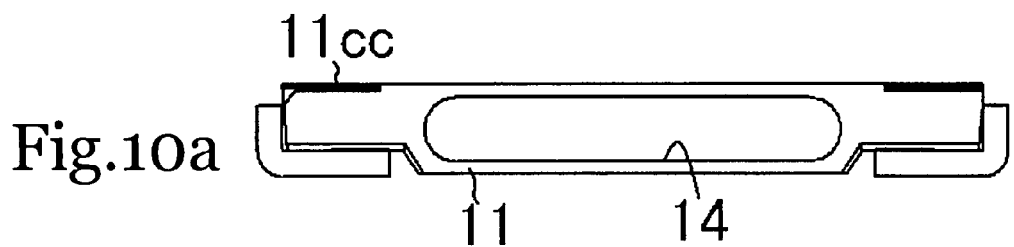
FIGS. 10a to 10f are simplified view, with 10a being a front view, 10b a rear view, 10c a plan view, 10d a bottom view, 10e a left side view, 10f a right side view of the main components in another light emitting device of the present invention.
Figure 10B:
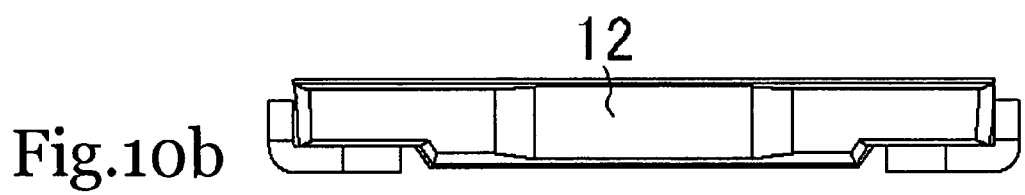
Figure 10C:
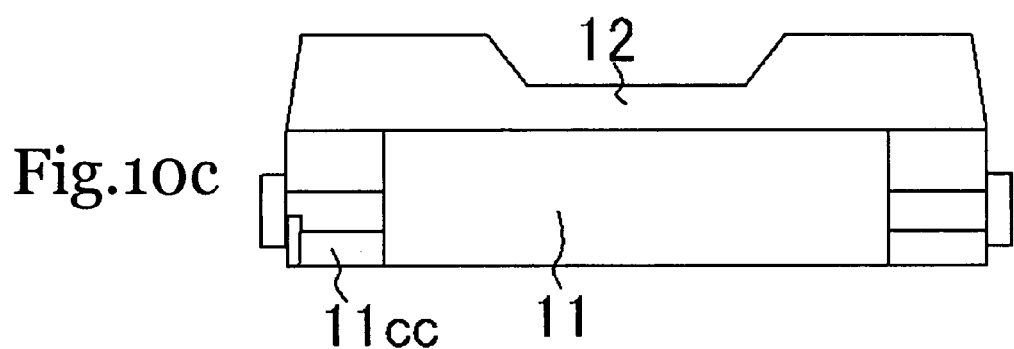
Figure 10D:
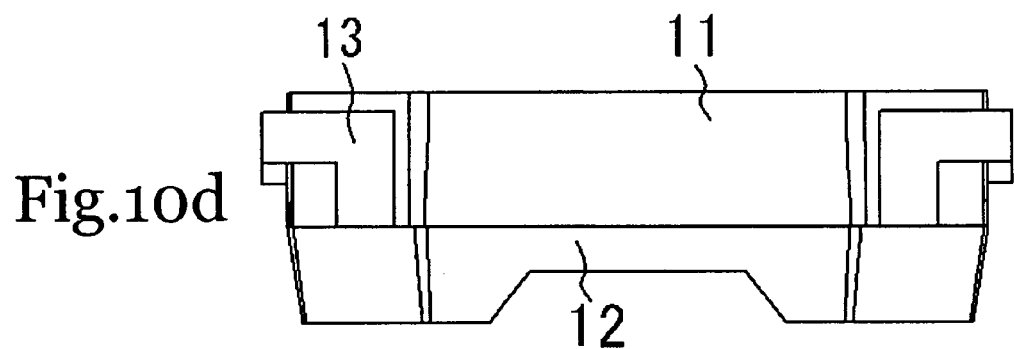
Figure 10E:
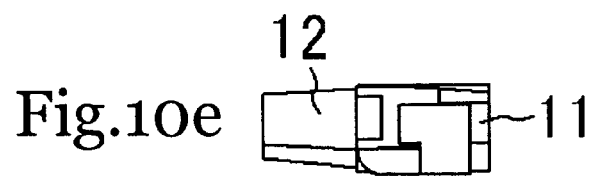
Figure 10F:
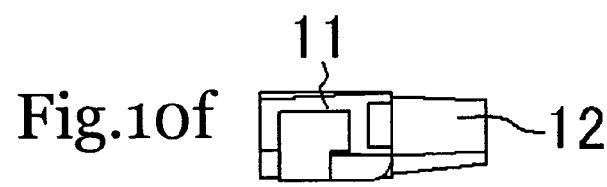
Figure 12A:
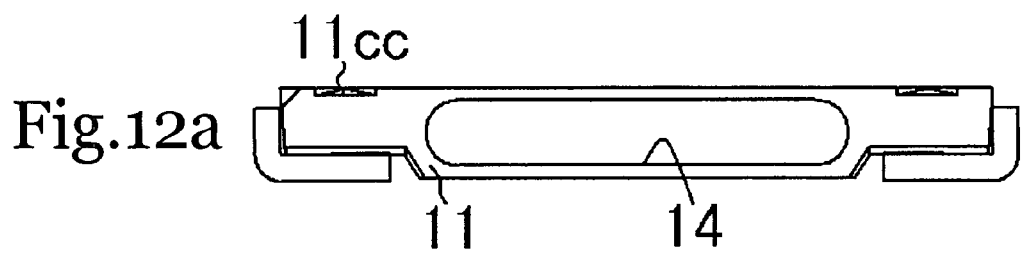
FIGS. 12a to 12f are simplified view, with 12a being a front view, 12b a rear view, 12c a plan view, 12d a bottom view, 12e a left side view, 12f a right side view of the main components in another light emitting device of the present invention.
Figure 12B:
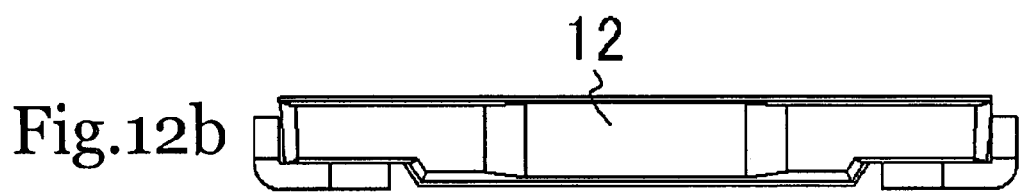
Figure 12C:
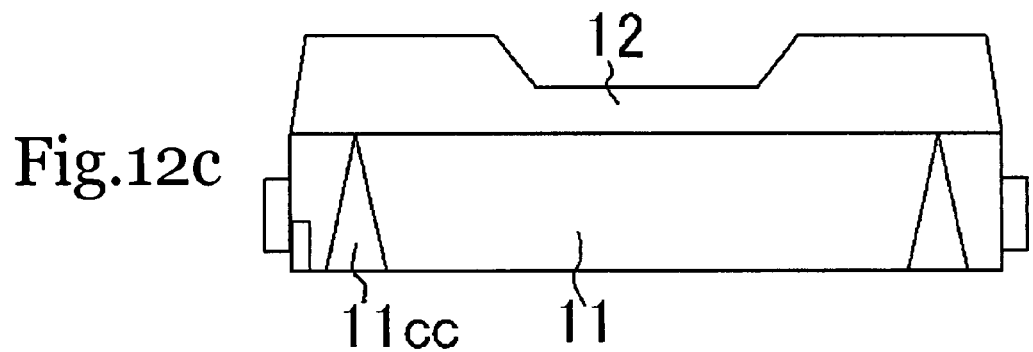
Figure 12D:
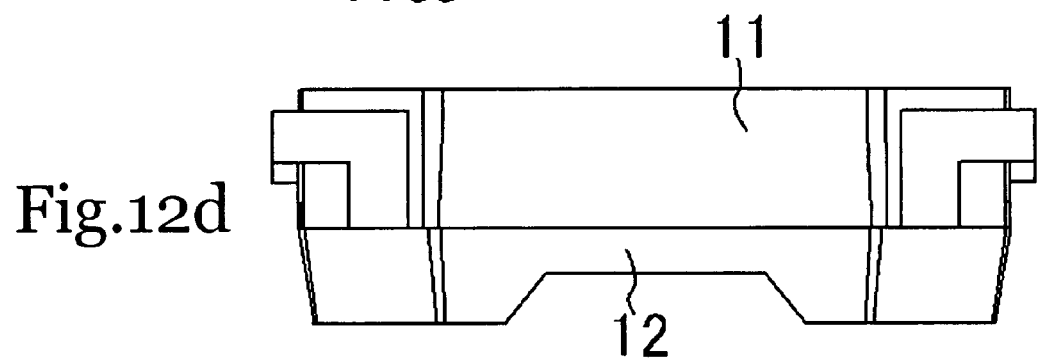
Figure 12E:
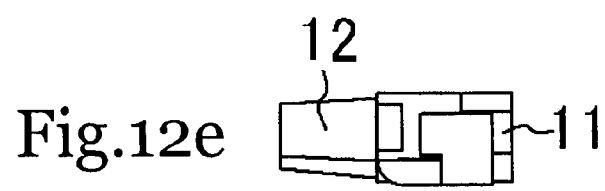
Figure 12F:
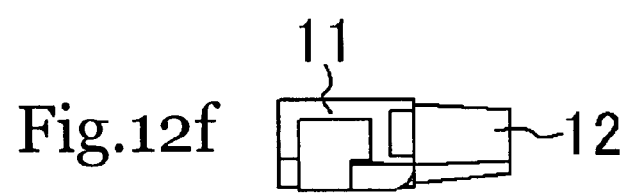

As shown in FIG. 7, the light emitting device 40 of this Example has a structure that is substantially the same as that in Example 1 except that the front face side package 41 is disposed only in concavities 41*b*, and the shape of the opening 44 is substantially elliptical.

This yields the same effect as in Example 1.

EXAMPLE 6

As shown in FIG. 4*a* and 8*a* to 8*f,* the light emitting device of this Example has the same constitution as in Example 1, except that the width of the cut-outs 11*c* are larger than the cut-outs in Example 1.

This yields the same effect as in Example 1.

EXAMPLE 7

As shown in FIG. 4*b* and 9*a* to 9*f,* the light emitting device of this Example has the same constitution as in Example 1, except that the cut-outs 11*c* are formed a specific distance toward the opening from the end of the package in the lengthwise direction.

This yields the same effect as in Example 1.

EXAMPLE 8

As shown in FIG. 4*e* and 12*a* to 12*f,* the light emitting device of this Example has the same constitution as in Example 1, except that the cut-outs 11*c* are formed triangular.

This yields the same effect as in Example 1.

This application claims priority to Japanese Patent Application Nos. 2006-222150 and 2006-318927. The entire disclosure of Japanese Patent Application Nos. 2006-222150 and 2006-318927 are hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims.

Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A light emitting device, comprising:
  a light emitting element;
  a plurality of lead frames electrically connected to the light emitting element; and
  a package that extends in the lengthwise direction, has an opening in its front face for taking out light from the light emitting element, and makes one end of the lead frames to protrude to the outside of the package with at least a part of the lead frames being sandwiched by the package,
  wherein the package has cut-outs in part of its outer surface on both sides in the lengthwise direction of the opening on a front face side of the package, and
  the width of the cut-outs in the lengthwise direction increases from a rear face side of the package toward the front face side, and a depth of the cut-outs from a top face side of the package toward a bottom face side of the package increases from the rear face side toward the front face side.

2. The light emitting device according to claim 1, wherein a bottom face of each cut-out forms an angle ∝ of greater than 90° and no more than 135° with the front face side of the package.

3. The light emitting device according to claim 1, wherein a side face on the opening side of each cut-out forms an angle (β) of greater than 90° and no more than 135° with the front face side of the package in plan view.

4. The light emitting device according to claim 1, wherein the cut-out is formed such that the depth increases in two or more stages from the rear face side toward the front face side.

5. The light emitting device according to claim 1, wherein the cut-out is formed such that the depth increases gradually from the rear face side toward the front face side.

6. The light emitting device according to claim 1, wherein the cut-out is formed such that the cut-out has a plurality of different angles formed by the bottom face thereof and the front face of the package in the lengthwise direction of the package.

\* \* \* \* \*